United States Patent [19]
Rowland

[11] Patent Number: 6,006,111
[45] Date of Patent: Dec. 21, 1999

[54] SELF-BALANCING MATRIX AMPLIFIER

[75] Inventor: Andy Rowland, Kanata, Canada

[73] Assignee: Nortel Networks Corporation, Montreal, Canada

[21] Appl. No.: 08/947,034

[22] Filed: Oct. 8, 1997

[51] Int. Cl.[6] .................................................. H04Q 7/20
[52] U.S. Cl. ........................................ 455/561; 330/124 R
[58] Field of Search .................................. 455/403, 561, 455/103, 194.2, 219, 220, 232.1, 245.1, 341; 330/124 R, 129

[56] References Cited

U.S. PATENT DOCUMENTS

| | | | |
|---|---|---|---|
| 5,561,395 | 10/1996 | Melton et al. | 330/124 R |
| 5,621,352 | 4/1997 | Botti et al. | 330/124 R |
| 5,783,969 | 9/1996 | Luz | 330/124 R |
| 5,834,972 | 10/1996 | Schiemenz, Jr. et al. | 330/124 R |
| 5,861,774 | 12/1996 | Blumenthal | 330/124 R |
| 5,892,396 | 7/1997 | Anderson et al. | 330/124 R |
| 5,917,371 | 7/1997 | Chesarek et al. | 330/124 R |

FOREIGN PATENT DOCUMENTS

| | | |
|---|---|---|
| 2158330 | 3/1996 | Canada . |
| 2167551 | 12/1996 | Canada . |

*Primary Examiner*—Dwayne D. Bost
*Assistant Examiner*—Jean A. Gelin

[57] ABSTRACT

A self balancing matrix amplifier is provided in which a plurality of input signals are divided with an input transform matrix, amplified by a number of amplifiers, and recombined with an output transform matrix to form amplified versions of the input signals. One of the inputs is set aside as a monitor input, and this is connected to the characteristic impedance of the system. The output corresponding to this input is monitored for gain imbalances which should be zero if the entire matrix amplifier is perfectly balanced. Then, on the basis of the monitored phase and gain imbalances, attenuators and phase adjusters in series with each of the amplifiers are iteratively controlled so as to insert phase shift or gain/loss so as to reduce the monitored phase and gain imbalances.

20 Claims, 7 Drawing Sheets

SELF-BALANCING MATRIX AMPLIFIER

FIELD OF THE INVENTION

The invention relates to matrix amplifiers and their application to the amplification of signals transmitted by tri-cellular/tri-sector basestations.

BACKGROUND OF THE INVENTION

Conventional basestation transmitters typically have a plurality of radio channel units each assigned to dedicated amplifier resources and dedicated antennas. There may be an individual amplifier for each radio channel unit, or several of the radio units may have their signals combined before being amplified. These are inefficient and inflexible ways to allocate amplifier resources. To illustrate the limitations of such current systems, consider a tri-sectored system having sectors X, Y, Z with 10 available physical user assigned radio channel units per sector, and for simplicity assume a radio channel unit can service only one caller at a time. Then in the situation when there is an uneven loading of say 6, 9, and 12 users in sectors X, Y and Z respectively, then callers 11 and 12 in sector Z will be blocked. This blocking is done by virtue of there not being enough radio channel units assigned to sector Z, even though there are 5 unassigned radio channel units in the remaining sectors.

European patent application no. EP 704964 made public on Apr. 3, 1996 to Meredith, entitled "Power Sharing System for High Power RF Amplifiers" discloses a system for amplifying a plurality N of antenna inputs in which the amplification load of all the antenna inputs is spread evenly across a plurality N of amplifiers and more importantly in which radio channel units are assignable to any antenna. An input transform matrix divides each signal to be amplified into N divided signals, each divided signal having a fraction 1/N of the power of the original signal. The input to each amplifier is a combination of a divided signal from each signal to be amplified. Each amplifier produces an amplified combination of the divided signals. An output transform matrix then recombines the divided signals so as to produce amplified versions of the signals to be amplified. Meredith points out that it is important that the phase shift introduced in each of the input transform matrix, the amplifiers and the output transform matrix must be balanced such that the recombined signals do not contain undesired components from incorrect input signals. It is suggested that such phase balancing may be accomplished by controlling the lengths of certain signal lines, and/or by adjusting the phase shift introduced by the amplifiers.

Meredith does not suggest how to control the lengths of the signal lines or how the phase shift adjustments for the amplifiers is achieved. Furthermore, Meredith does not mention that in addition to phase balancing, gain balancing must also be performed. If any type of gain or phase mismatch is introduced, then the output signals will contain undesirable components.

SUMMARY OF THE INVENTION

It is an object of the invention to obviate or mitigate one or more of the above identified disadvantages.

According to a first broad aspect, the invention provides a self-balancing matrix amplifier for amplifying N input signals to produce N amplified output signals where N is an integer greater than or equal to two, comprising: an input transform matrix having M first inputs and M first outputs where M is an integer at least one greater than N, N of the first inputs being connected to receive the N input signals with the remaining M–N first inputs connected receive zero input signals; an output transform matrix having M second inputs and M second outputs, the M second outputs including N second outputs for producing said N amplified output signals with the remaining M–N second outputs corresponding with said remaining M–N first inputs; amplifiers each having an amplifier input connected to a respective one of the M first outputs and having an amplifier output connected to a corresponding respective one of the M second inputs; M–1 phase adjusters, with each of the M phase adjusters connected to introduce a phase shift in the path between one of said M first outputs and the corresponding one of said M second inputs; M gain adjusters, with each of the M gain adjusters connected to introduce a gain in the path between one of said M first outputs and the corresponding one of the M second inputs; a monitor circuit connected to one of said remaining M–N second outputs and connected to control the phase shifts introduced by said phase adjusters and the gains introduced by said gain adjusters; wherein: the N input signals are divided by the input transform matrix, amplified by the M amplifiers and recombined by the output transform matrix to produce the N amplified output signals at said N second outputs and a monitor output signal at said one of said remaining M–N second outputs; and the monitor circuit measures a monitor power of the monitor output signal with respect to the test input signal and controls said phase delays and said gains iteratively so as to cause said monitor power to approach zero.

According to a second broad aspect, the invention provides a self-balancing matrix amplifier for amplifying N input signals to produce N amplified output signals where N is an integer greater than or equal to two, comprising: an input transform matrix having M first inputs and M first outputs where M is an integer at least one greater than N, N of the first inputs being connected to receive the N input signals with the remaining M–N first inputs connected receive test input signals; an output transform matrix having M second inputs and M second outputs, the M second outputs including N second outputs for producing said N amplified output signals with the remaining M–N second outputs corresponding with said remaining M–N first inputs; amplifiers each having an amplifier input connected to a respective one of the M first outputs and having an amplifier output connected to a corresponding respective one of the M second inputs; M–1 phase adjusters, with each of the M phase adjusters connected to introduce a phase shift in the path between one of said M first outputs and the corresponding one of said M second inputs; M–1 gain adjusters, with each of the M gain adjusters connected to introduce a gain in the path between one of said M first outputs and the corresponding one of the M second inputs; a monitor circuit connected to one of said remaining M–N second outputs and connected to control the phase shifts introduced by said phase adjusters and the gains introduced by said gain adjusters; wherein: the N input signals are divided by the input transform matrix, amplified by the M amplifiers and recombined by the output transform matrix to produce the N amplified output signals at said N second outputs and a monitor output signal at said one of said remaining M–N second outputs; and the monitor circuit measures a first monitor power of a portion of the monitor output signal which is attributable to the test input signal and controls said phase delays and said gains iteratively so as to maximize said first monitor power.

According to a third broad aspect, the invention provides a basestation transmitter comprising: a plurality L of radio channel units where L≧1 N combiners; where N≧1 a plurality L of single pole M throw switches where L≧1, each switch having an output connectable to any one of the M combiners by appropriately controlling the switch, each switch connected to receive an input radio signal from a respective radio channel unit wherein the input radio signals input to all of the switches connected to a given combiner are combined to produce a respective one of N input signals; an input transform matrix having M first inputs and M first outputs where M is an integer at least one greater than N, N of the first inputs being connected to receive the N input signals with the remaining M–N first inputs connected receive zero input signals; an output transform matrix having M second inputs and M second outputs, the M second outputs including N second outputs for producing said N amplified output signals with the remaining M–N second outputs corresponding with said remaining M–N first inputs; amplifiers each having an amplifier input connected to a respective one of the M first outputs and having an amplifier output connected to a corresponding respective one of the M second inputs; M–1 phase adjusters, with each of the M phase adjusters connected to introduce a phase shift in the path between one of said M first outputs and the corresponding one of said M second inputs; M gain adjusters, with each of the M gain adjusters connected to introduce a gain in the path between one of said M first outputs and the corresponding one of the M second inputs; a monitor circuit connected to one of said remaining M–N second outputs and connected to control the phase shifts introduced by said phase adjusters and the gains introduced by said gain adjusters; a sectorized antenna having N sectors connected tp transmit the N amplified output signals; wherein: the N input signals are divided by the input transform matrix, amplified by the M amplifiers and recombined by the output transform matrix to produce the N amplified output signals at said N second outputs and a monitor output signal at said one of said remaining M–N second outputs; and the monitor circuit measures a monitor power of the monitor output signal with respect to the test input signal and controls said phase delays and said gains iteratively so as to cause said monitor power to approach zero.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
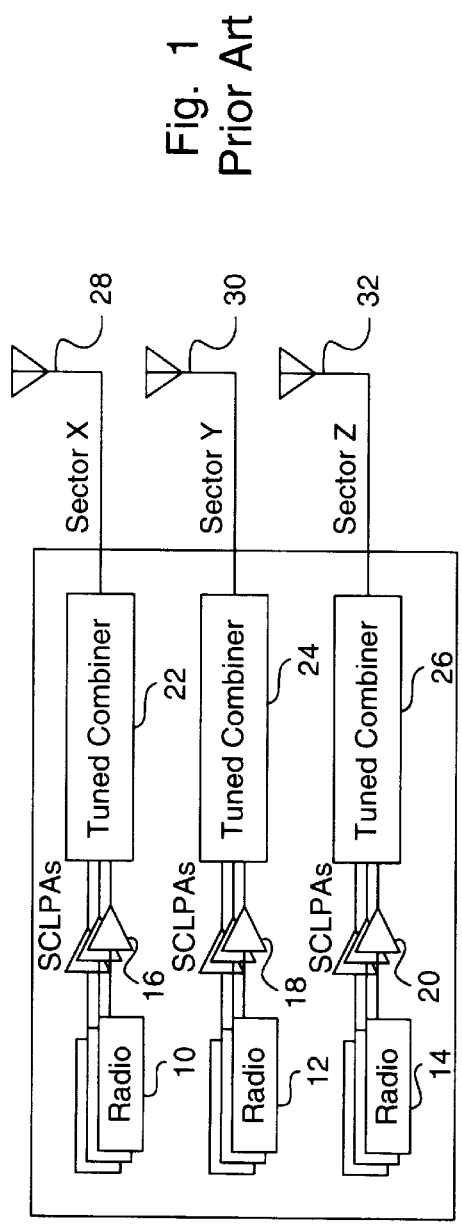
FIG. 1 is a block diagram of a conventional single channel linearized power amplifier based cell-site transmitter.

Referring to FIG. 1, a conventional tri-sector basestation transmitter design is shown in which a set of K radio channel units 10, 12, 14 is assigned for each of three sectors X,Y and Z respectively giving a total of 3*K radio channel units for the basestation. In the illustrated example, K=3, so the basestation has 9 radio channel units. For each set of radio channel units 10,12,14 in each sector, there is a corresponding set of SCLPAs (single carrier linear power amplifiers) 16,18,20 to perform amplification. The amplified signals for each sector X,Y,Z are combined with a respective tuned combiner 22,24,26 to produce an amplified signal for transmission by a given sector antenna 28,30,32.

Figure 2:
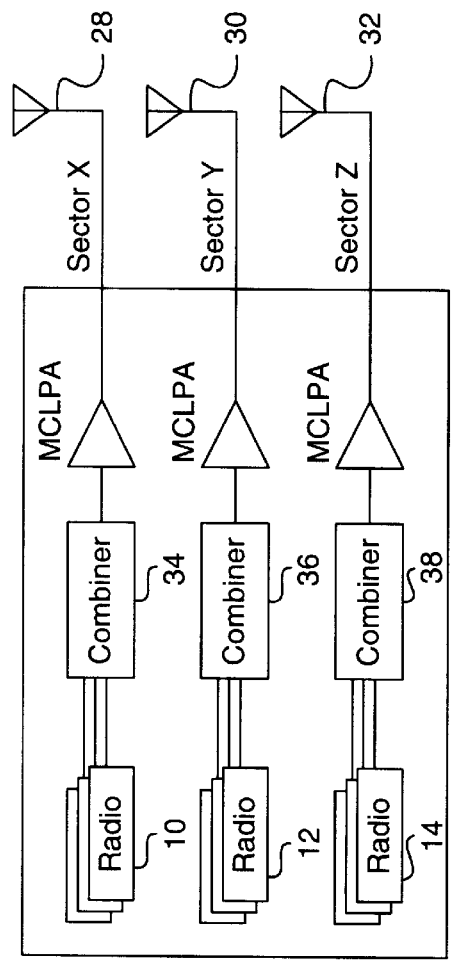
FIG. 2 is a block diagram of a conventional multi-carrier linearized power amplifier based cell-site transmitter.

Referring now to FIG. 2, another conventional tri-sector basestation design is shown in which again a set of K radio channel units 10,12,14 are assigned to each of three sectors respectively. The non-amplified signals generated by the set of radio channel units 10,12,14 assigned to a given sector are combined with a respective combiner 34,36,38. Each resulting combined signal is then amplified with a respective MCLPA (multi-carrier linear power amplifier) 40,42,44 to produce an amplified signal for transmission by a given sector antenna 28,30,32.

In both of the above examples, each amplifier resource is dedicated to a particular predetermined sector antenna, and similarly each radio channel unit is assigned to a particular amplifier.

Figure 3:
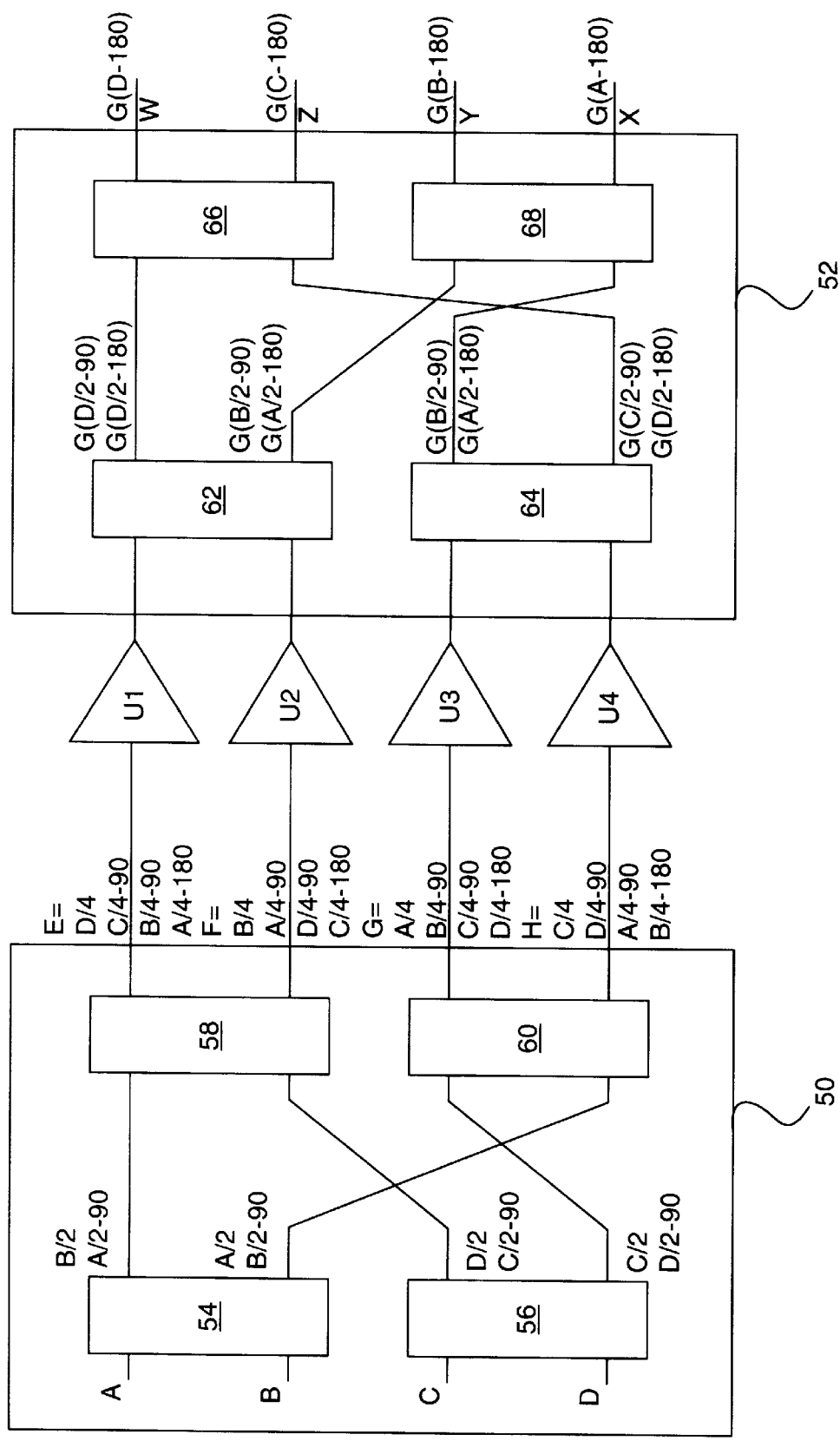
FIG. 3 is a block diagram of a conventional 4×4 matrix power amplifier.

Referring now to FIG. 3, a conventional (as disclosed in Meredith) 4×4 power amplification system is shown consisting of an input hybrid matrix 50 (referred to as an input transform matrix in the Canadian application) four amplifiers U1,U2,U3,U4, and an output hybrid matrix 52 (referred to as an output transform matrix in the Canadian application). Meredith teaches that if there are N antennas where N is a power of m, e.g. N=m^r then the transform matrix is a Fourier transform matrix using a radix-m decimation in frequency algorithm having r stages. For the illustrated example, N=4, and the Fourier transform matrix is a radix-2 decimation in frequency algorithm having 2 stages. There is no suggestion in Meredith of applying this technique to a number of inputs not satisfying N=m^r for some m, r.

The input hybrid matrix is comprised of four 90 degree phase splitters 54,56,58,60 and similarly the output hybrid matrix is comprised of four 90 degree phase splitters 62,64, 66,68. Four signals A,B,C,D are input to the input hybrid matrix 50. By way of example, phase splitter 54 takes its two inputs A,B and produces two outputs which are combinations of the two inputs, namely $B/2+A/2\angle-90$, $A/2+B/2\angle-90$. The other phase splitters function the same way. Four signals E,F,G,H are output by the hybrid matrix 50 each of which includes a component from each of the four input signals A,B,C,D. More particularly, the four outputs are:

$$E=A/4\angle-180+B/4\angle-90+C/4\angle-90+D/4$$

$$F=A/4\angle-90+B/4+C/4\angle-180+D/4\angle-90$$

$$G=A/4+B/4\angle-90+C/4\angle-90+D/4\angle-180$$

$$H=A/4\angle-90+B/4\angle-180+C/4+D/4\angle-90$$

These are input to the four amplifiers U1,U2,U3,U4 having gains G1,G2,G3,G4 respectively, and phase shifts $\phi1,\phi2,\phi3,\phi4$ respectively so as to produce output signals $G1E\angle\phi1$, $G2F\angle\phi2$, $G3G\angle\phi3$, and $G4H\angle\phi4$. These are then passed through the output hybrid matrix 52 which recombines the various portions of each input signal to produce amplified signals at ports W,X,Y,Z. If the input and output hybrid matrices 50,52 and amplifiers U1,U2,U3,U4 are perfectly balanced with respect to gain and phase, then the signals at output ports X,Y,Z,W will be amplified versions of the signals input to ports A,B,C,D respectively. More generally, each output will include desired components corresponding to its respective input, and undesired components corresponding to the other inputs. For example, the desired signal at X would consist of the following:

Components of A=G1(A/4,∠φ1−180)+G2(A/4,∠φ2−180)+G3(A/4, ∠φ3−180)+G4(A/4,∠φ4−180)

The undesired signal would consist of the following components of B,C and D:

Components of B=G1(B/4,∠φ1−90)+G2(B/4,∠φ2−90)+G3(B/4, ∠φ3−270)+G4(B/4,∠φ4−270)

Components of C=G1(C/4,∠φ1−90)+G2(C/4,∠φ2−270)+G3(C/4, ∠φ3−270)+G4(C/4,∠φ4−90)

Components of D=G1(A/4,∠φ1)+G2(D/4,∠φ2−180)+G3(D/4, ∠φ3−360)+G4(D/4,∠φ4−180)

Similar expressions may be written for the desired and undesired components at output ports Y,Z, and W. Clearly, without the proper balancing of φb 1,φ2,φ3,φ4 and G1,G2, G3,G4, the output at X will contain undesired components. This not only detracts from the quality of the signal at X in terms of increasing the level of interference, but is also decreasing the power level of the desired signal since portions of it are being combined at other outputs.

Figure 4:
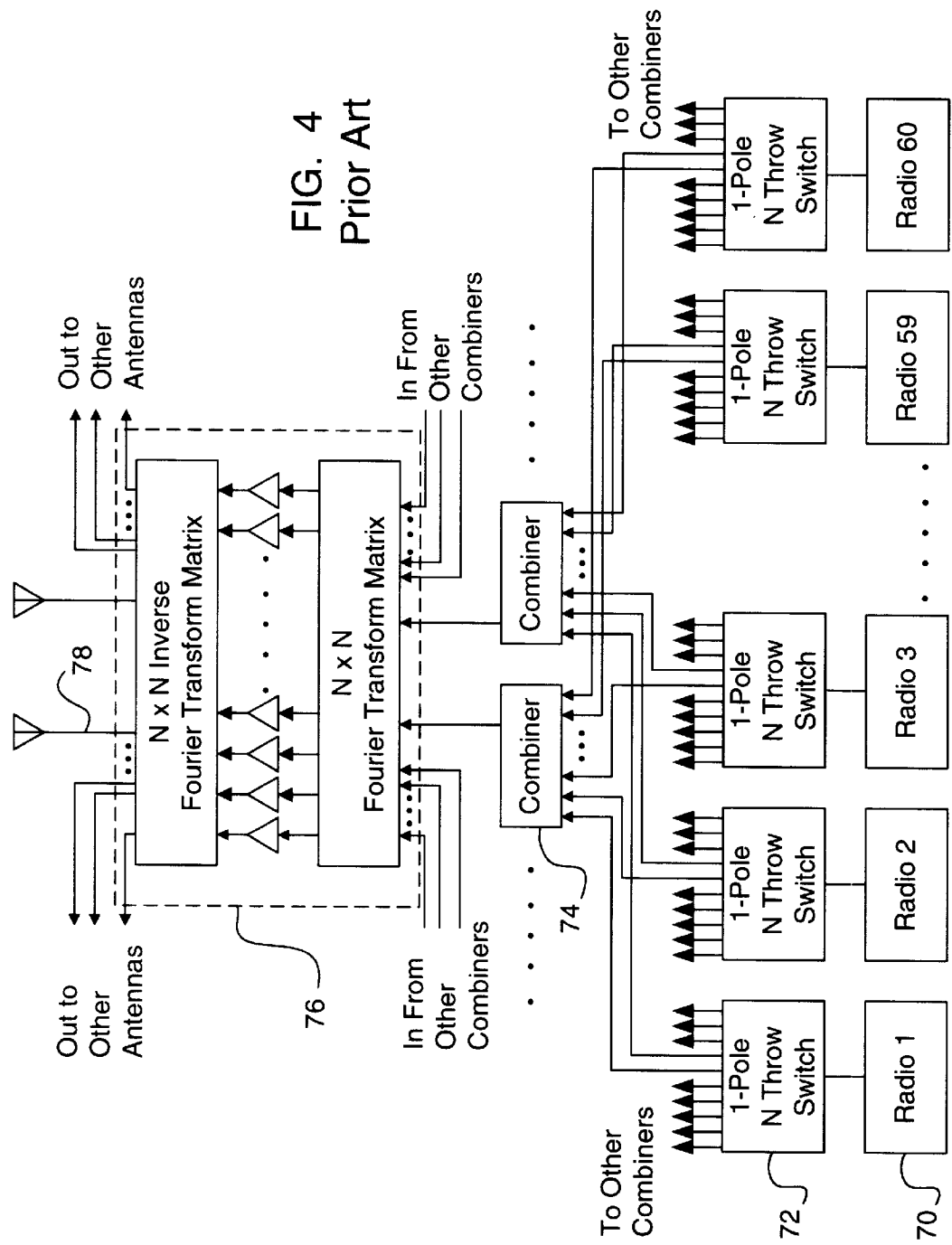
FIG. 4 is a block diagram of a conventional cell-site transmitter architecture.

Referring now to FIG. 4, a version of the Matrix power amplifier of FIG. 3 is applied to a transmitter having 60 radio channel units 70. Each radio channel unit 70 is connected to a 1-pole N-throw switch 72 which, depending on the position of the switch, connects the radio channel unit to one of N combiners 74. Selecting which combiner 74, switch 72 is connected to selects which antenna 78 that radio channel unit will transmit on. The N combiners 74 are connected to the input of an N×N matrix amplifier 76 as described above with reference to FIG. 3. This allows any radio channel unit to be assigned to any antenna.

Figure 5:
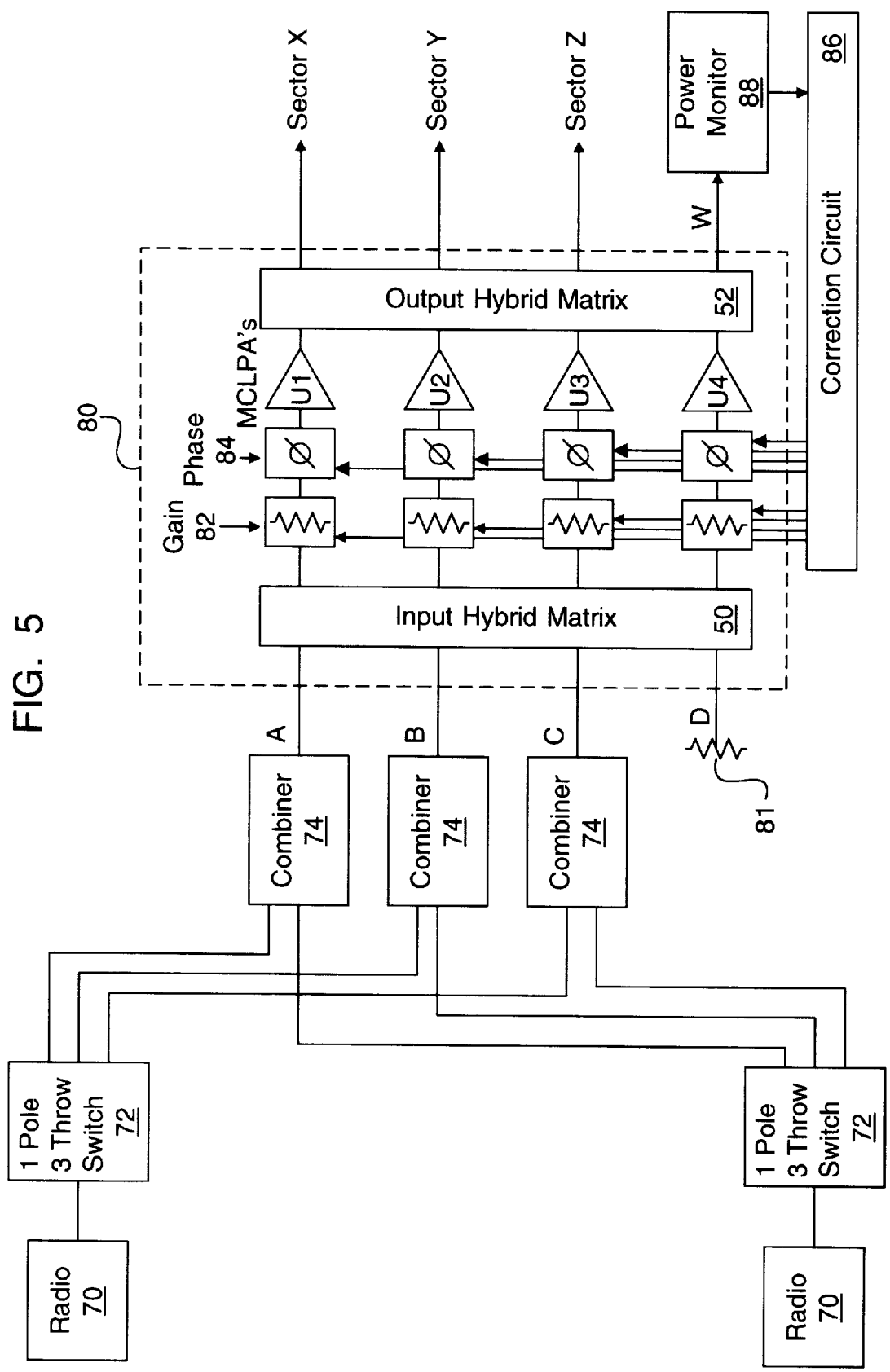
FIG. 5 is a block diagram of a cell-site transmitter according to an embodiment of the invention.

Turning now to FIG. 5, a portion of a tri-sector basestation transmitter according to an embodiment of the invention is shown. There are a plurality of radio channel units 70 each connectable through a respective single pole three throw switch 72 to any one of three sector combiners 74. The three combiners 74 are connected to three inputs A,B,C of a 4×4 matrix power amplifier 80 with a fourth input D to the matrix power amplifier being connected to ground through an impedance 81 equal to the characteristic impedance of the system. The matrix power amplifier 80 has three output ports X,Y,Z at which are produced output signals corresponding to the amplified versions of the signals produced by each of the three sector combiners 74. The matrix power amplifier 80 has a fourth output port W which carries a monitor signal "MON", which is ideally an amplified version of the signal at the fourth input D, this being zero. The matrix power amplifier 80 includes an input hybrid matrix 50 and an output hybrid matrix 52, and four amplifiers U1,U2,U3,U4 all such as described previously with reference to FIG. 3. In addition the matrix power amplifier includes four attenuators 82 and four phase adjusters 84, one attenuator and one phase adjuster connected between each output of the input hybrid matrix 50 and the input to the corresponding amplifier U1,U2,U3,U4. The attenuators 82 and adjusters 84 are under the control of a correction circuit 86 connected to a power monitor 88 which measures the power of the signal MON at the fourth output, port W, of the output hybrid matrix 52.

The correction circuit monitors the power measurements taken by the power monitor 88 for the signal at the fourth output port W. Since the input port corresponding with port W, namely port D, is connected to ground through the characteristic impedance 81 of the system, if the matrix power amplifier were perfectly balanced then the signal output at port W would be zero. However, if the signal strength at port W are not zero, then the signal strength of W may be used iteratively to determine phase and gain corrections required for the matrix power amplifier such that the power at port W approaches zero. When the power of the signal at port W is near zero, the signals at the three sector output ports X,Y,Z will not contain any undesired components, i.e. they will only contain desired components and the normal intermodulation products.

The correction circuit may for example be a fairly conventional feedback system. Taking the monitored output power as a measure of the balance of the matrix power amplifier, search techniques may be applied to adjust the gain and phase in each arm of the matrix amplifier. Minimum power at the monitor port W is directly proportional to balance in the matrix amplifier and isolation at the output ports of the matrix amplifier.

The search technique for minimum power does not need to be random, other search techniques such as gradient or Tagguchi could be applied.

Figure 6:
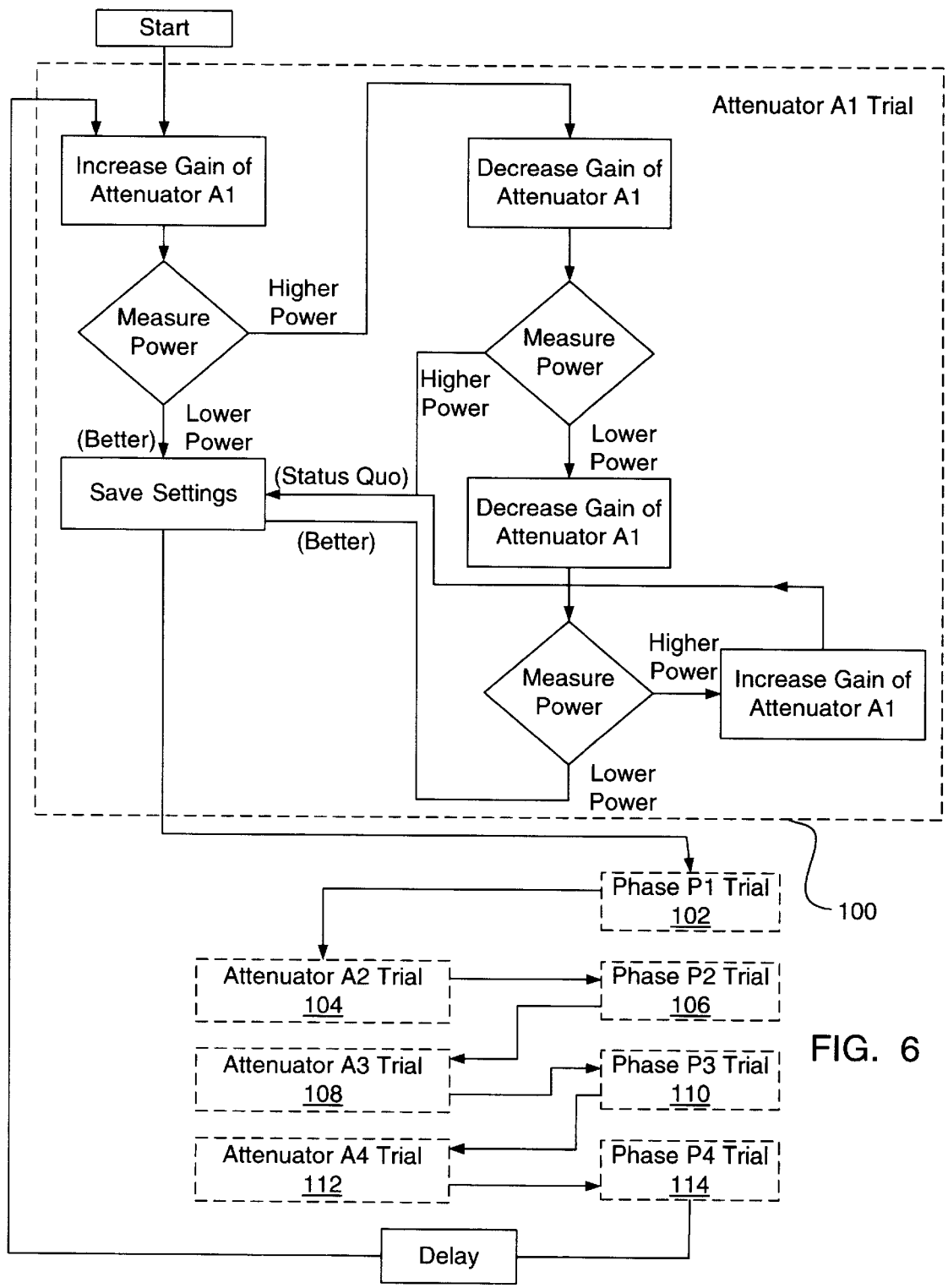
FIG. 6 is a flow chart of steps performed by the correction circuit of FIG. 6.

An example search technique will be described with reference to FIG. 6. It is assumed that the four attenuators 82 introduce gains of A1,A2,A3,A4 respectively and the four phase adjusters 84 introduce phase shifts of P1,P2,P3,P4. The search technique comprises first adjusting a first of the four attenuators (block 100), then adjusting a first of the four phase shifters (block 102) and then adjusting the remaining attenuators and phase shifters in sequence (blocks 104,106, 108,110,112,114). The details of the adjustment of the first attenuator are shown (block 100), and similar steps are performed in the adjustment of the phase shifters and the remaining attenuators, these steps not being shown in the flow chart for brevity.

The first step in adjusting the first attenuator is to increase the gain A1 of the attenuator by some small predetermined amount. Then the power level of the signal at monitor port W is measured. If the power has decreased, then the increase in gain A1 represents an improvement, and this new value is saved. If the new setting results in a higher power in the monitor signal, then the new power level represents a degradation, and the gain A1 is decreased to its original value. The power level of W is again measured. If this has increased, then it appears that neither an increase or a decrease in the attenuator gain A1 will result in an improvement, and as such the original settings are saved. If the power level has decreased, then a further decrease in the attenuator gain A1 is made, and the power in the monitor signal remeasured. If this has resulted in an increase in the power, then the gain is returned to its previous value and the setting saved. If the power has gone down then the new values are saved.

Following this, a similar procedure is performed for the other gains A2,A3,A4 and phases P1,P2,P3,P4. For the phase adjuster corrections the power at monitor port W is again measured. The entire flow chart will continue to repeat until status quo is achieved, this will correspond to the best achievable balance given the hardware limitations. Hardware limitations such as dispersion, phase and gain resolution/stability will limit complete balance and therefore will also limit isolation between outputs. As external factors change (such as temperature) the feedback loop will adjust gain and phase to yield the best obtainable isolation. The rate of adjustment is dependent on the required system performance, and the nature of the data being transmitted. Also adjustments should be made at slot boundaries in bursty data systems, or slowly in continuous transmission systems to minimize disturbance to traffic. Another consideration is that the response time and type of power sensor used may also limit the rate of adjustment. The power detector should be a true average type power detector to eliminate the effects of non-constant envelope modulation formats.

As an example of the type of adjustments which might be made, let the phases and gains introduced by the arms 1 to 4 of each of the four MCLPA's be $\phi1,\phi2,\phi3,\phi4$ and G1,G2, G3,G4 respectively, where these phases and gains include the phases and gains introduced by the MCLPA's themselves and also phases and gains introduced by the various connecting wires. Assume the phase shifters introduce the phases P1, P2,P3 and P4 into arms 1 to 4 respectively, and the attenuators in arms 1 to 4 introduce gains A1, A2, A3 and A4 respectively. To obtain balance we require the total gain and phase shift in each arm to be equal. Mathematically, we require the following:

For phase balance:

$$P1+\phi1=P2+\phi2=P3+\phi3=P4+\phi4$$

For gain balance:

$$G1+A1=G2+A2=G3+A3=G4+A4$$

The solution space for balance is not unique. A numerical example illustrates this more clearly. Let G1=40.25+/−3 dB
G2=41.80+/−3 dB
G3=39.26+/−2.8 dB
G4=43.00+/−3 dB In this example the maximum possible gain is G4+3 dB=46 dB and the minimum possible gain is G3−2.8 dB=36.46 dB. The attenuators (or gain adjust element) therefore need a minimum adjust range of 9.54 dB. A solution for gain tracking could be:

G1+A1=40.25−3.25=37 dB
G2+A2=41.80−4.80=37 dB
G3+A3=39.26−2.26=37 dB
G4+A4=43.00−6.00=37 dB

An alternative solution could be:

G1+A1=40.25−0.99=39.26 dB
G2+A2=41.80−2.54=39.26 dB
G3+A3=39.26−0=39.926 dB
G4+A4=43.00−3.74=39.26 dB

The solutions have different total gains however.

The same is true for phase tracking in that there is no unique solution that gives phase balance. Again the phase shifting elements have to have sufficient tuning range to obtain phase tracking.

The above described implementation can be applied to both of a tri-cellular or tri-sector base station. At the base station the only difference between tri-cellular and tri-sector cell-sites are the antennas and the shape of the intended coverage area.

Figure 7:
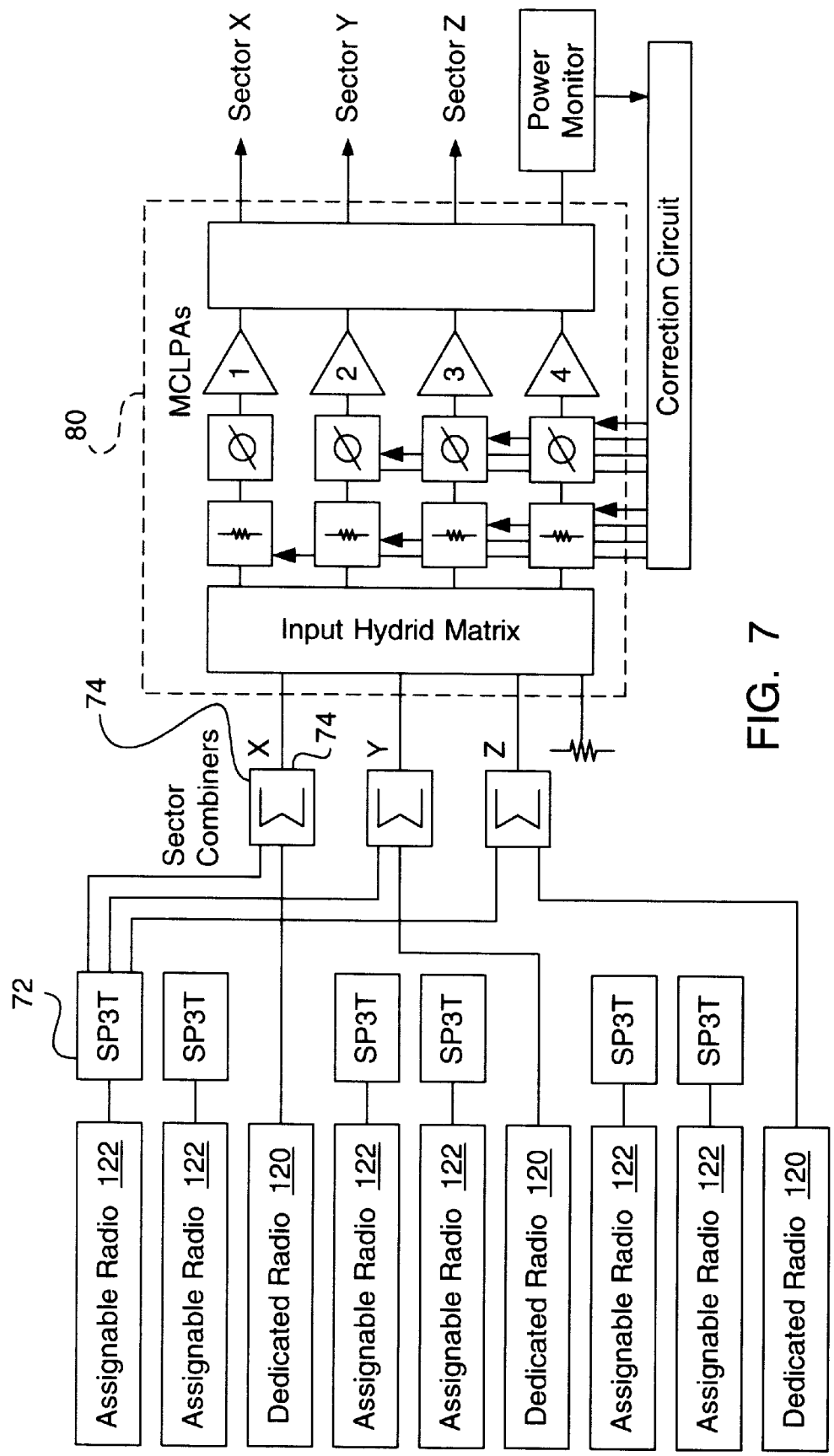
FIG. 7 is a block diagram of a basestation architecture including both dedicated radio channel units and assignable radio channel units.

In the above described example, all the assignable radio channel units are connected to each of the three sector combiners. Such a system can be configured to permit all radio channel units to be switched to any sector. It may be more cost effective in some cases to have a fraction on the radio channel units dedicated to each sector. This could be based on traffic statistics, and each sector could have a different number, or the same number of dedicated radio channel units. The remaining radio channel units would be capable of being dynamically assigned to any of the three sectors. An example of such a system is shown in FIG. 7 in which each sector has a single dedicated radio channel unit 120 and two assignable radio channel units 122. The dedicated radio channel units are connected directly to a particular sector combiner 74 while the assignable radio channel units 122 are connectable to any sector through a single pole-three throw switch 72.

In the illustrated embodiment there were three signal carrying inputs to the matrix amplifier and a single "zero input" corresponding with a single monitor output. Of course, there may be any number one or greater of signal carrying inputs and any number one or greater of zero inputs. When multiple zero inputs are used, a single corresponding output may be used for monitoring purposes, or multiple outputs may be used.

Figure 8:
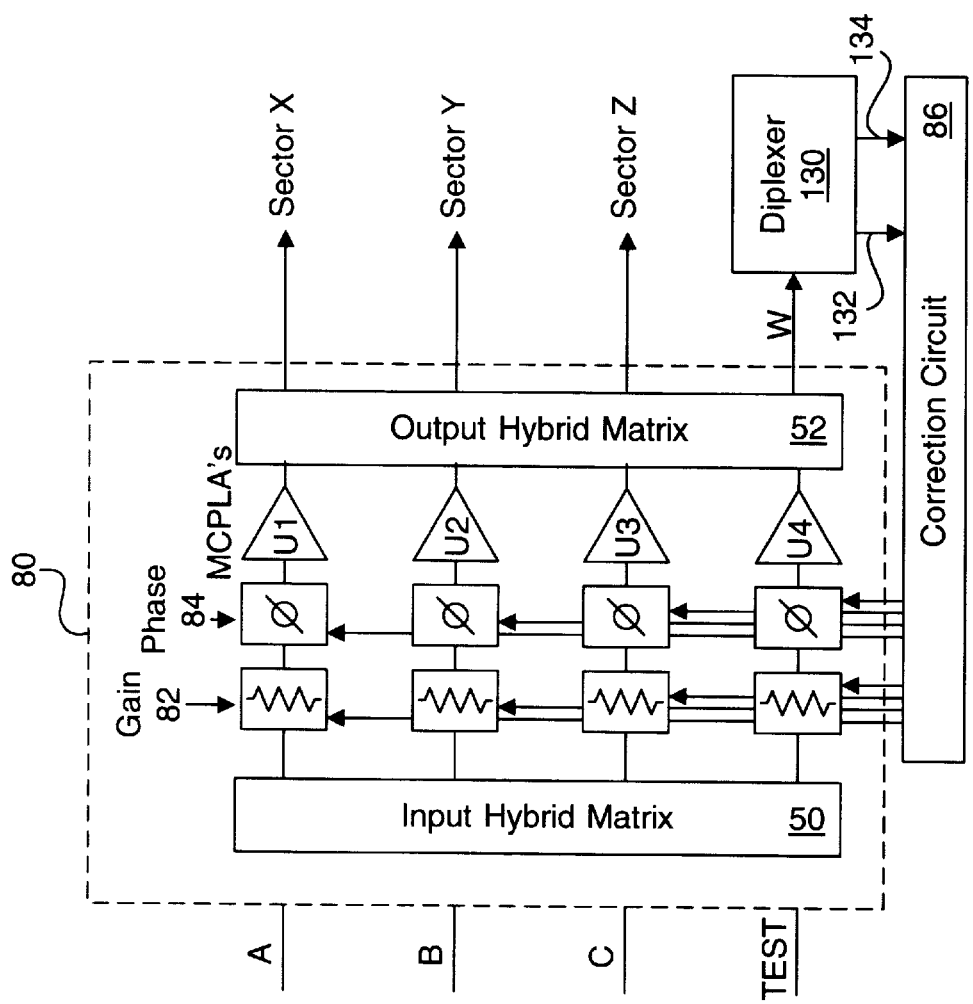
FIG. 8 is a block diagram of a matrix power amplifier according to another embodiment of the invention.

In the embodiment of the balanced matrix amplifier illustrated in FIG. 5, the test inputs are connected to ground. Alternatively, in another embodiment, these may be connected to receive some other known test input signal. An example of this is shown in FIG. 8. In this embodiment, the monitor output W is connected to the correction circuit through a diplexer 130. The diplexer 130 is configured to isolate with a bandpass filter for example the portion of the monitored signal W attributable to the test signal input and to determine its power and pass this to the correction circuit on line 132. The correction circuit then performs an iterative technique which attempts to maximize this power.

To further enhance performance, the diplexer 130 may also be configured to determine a power measurement for the portion of the monitored signal W which is not attributable to the test signal input, this being attributable to the remaining inputs. This is passed to the correction circuit on line 134. The correction circuit then would perform an iterative technique which both maximizes the desired amplified test signal power, and minimizes the power due to the remaining signals.

Numerous modifications and variations of the present invention are possible in light of the above teachings. It is therefore to be understood that within the scope of the appended claims, the invention may be practised otherwise than as specifically described herein.

In the illustrated embodiment, the phase adjusters and attenuators are between the input hybrid matrix and the amplifiers. However, they could be located anywhere between the input hybrid matrix and the output hybrid matrix.

In the illustrated embodiments, there is a phase adjuster and gain adjuster for each amplifier. This allows phase and gain adjustments to be made in each amplifier path. Alternatively there may be one amplifier path without the phase and gain adjusters. In this case, the gain and phase of the remaining paths must be adjusted such that all paths introduce the same gain and phase shift as the path without the adjusters. This is because a constant gain and a constant phase shift for all the paths will not result in any incorrect combination of signals at the output. The same correction technique applies, namely that of monitoring the power of the monitor output and adjusting the phase shifters and gain adjusters to minimize the monitor output power in the case that the input test signal is zero, or to maximize the monitor output power in the case that some other input test signal is employed.

The embodiments of the invention in which an exclusive property or privilege is claimed are defined as follows:

1. A self-balancing matrix amplifier for amplifying N input signals to produce N amplified output signals where N is an integer greater than or equal to two, comprising:

an input transform matrix having M first inputs and M first outputs where M is an integer at least one greater than N, N of the first inputs being connected to receive the N input signals with the remaining M−N first inputs connected receive zero input signals;

an output transform matrix having M second inputs and M second outputs, the M second outputs including N second outputs for producing said N amplified output signals with the remaining M−N second outputs corresponding with said remaining M−N first inputs;

M amplifiers each having an amplifier input connected to a respective one of the M first outputs and having an amplifier output connected to a corresponding respective one of the M−1 second inputs;

M−1 phase adjusters, with each of the M−1 phase adjusters connected to introduce a phase shift in the path between one of said M first outputs and the corresponding one of said M second inputs;

M−1 gain adjusters, with each of the M−1 gain adjusters connected to introduce a gain in the path between one of said M first outputs and the corresponding one of the M second inputs;

a monitor circuit connected to one of said remaining M−N second outputs and connected to control the phase shifts introduced by said phase adjusters and the gains introduced by said gain adjusters;

wherein:

the N input signals are divided by the input transform matrix, amplified by the M amplifiers and recombined by the output transform matrix to produce the N amplified output signals at said N second outputs and a monitor output signal at said one of said remaining M−N second outputs; and the monitor circuit measures a monitor power of the monitor output signal with respect to the test input signal and controls said phase delays and said gains iteratively so as to cause said monitor power to approach zero.

2. A self-balancing matrix amplifier according to claim 1 further comprising:

an $M^{th}$ phase adjuster connected to introduce a phase shift in the path between the last of said M first outputs and the corresponding one of said M second inputs;

an $M^{th}$ gain adjuster connected to introduce a gain in the path between the last of the M first outputs and the corresponding one of said M second inputs;

wherein the monitor circuit is connected to control the phase shift introduced by the $M^{th}$ phase adjuster and the gain introduced by the $M^{th}$ gain adjuster, and does so in the course of causing the monitor power to approach zero.

3. A self-balancing matrix amplifier according to claim 1 wherein said remaining M−N first inputs are connected through a system characteristic impedance.

4. A self-balancing matrix amplified according to claim 1 wherein N=3 and M=4 and the N input signals comprise signals received from three radio channel units.

5. A self-balancing matrix amplifier according to claim 4 wherein the three amplified output signals are transmitted by a sectorized basestation antenna.

6. A self-balancing matrix amplifier according to claim 1 further comprising:

N combiners;

a plurality L of single pole N throw switches where $L \geq 1$, each switch having an output connectable to any one of the N combiners by appropriately controlling the switch, each switch connected to receive an input radio signal from a respective radio channel unit;

wherein the input radio signals input to all of the switches connected to a given combiner are combined to produce a respective one of said input signals.

7. A self-balancing matrix amplifier according to claim 6 wherein M=4 and N=3 and the radio channel units are connected to a sectorized basestation antenna.

8. A self balancing matrix amplifier according to claim 1 wherein the each of the input transform matrix and the output transform matrix comprises a plurality of ninety degree phase shifters arranged in stages.

9. A self balancing matrix amplifier according to claim 6 wherein:

the input transform matrix comprises a first stage of two ninety degree phase shifters connected to a second stage of two ninety degree phase shifters:

the output transform matrix comprises a first stage of two ninety degree phase shifters connected to a second stage of two ninety degree phase shifters:

the input transform matrix produces four divided signals, each divided signal being a combination of the four input signals so as to have nominally one quarter of the power of each of the four input signals, the four divided signals being then amplified by the amplifiers to produce four amplified divided signals; and the output transform matrix combines the four amplified divided signals to produced the amplified output signals, each amplified output signal nominally being an amplified version of one of the input signals.

10. A self-balancing matrix amplifier for amplifying N input signals to produce N amplified output signals where N is an integer greater than or equal to two, comprising:

an input transform matrix having M first inputs and M first outputs where M is an integer at least one greater than N, N of the first inputs being connected to receive the N input signals with the remaining M−N first inputs connected receive test input signals;

an output transform matrix having M second inputs and M second outputs, the M second outputs including N second outputs for producing said N amplified output signals with the remaining M−N second outputs corresponding with said remaining M−N first inputs;

M amplifiers each having an amplifier input connected to a respective one of the M first outputs and having an amplifier output connected to a corresponding respective one of the M second inputs;

M−1 phase adjusters, with each of the M−1 phase adjusters connected to introduce a phase shift in the path between one of said M first outputs and the corresponding one of said M second inputs;

M−1 gain adjusters, with each of the M−1 gain adjusters connected to introduce a gain in the path between one of said M first outputs and the corresponding one of the M second inputs;

a monitor circuit connected to one of said remaining M−N second outputs and connected to control the phase shifts introduced by said phase adjusters and the gains introduced by said gain adjusters;

wherein:

the N input signals are divided by the input transform matrix, amplified by the M amplifiers and recombined by the output transform matrix to produce the N amplified output signals at said N second outputs and a monitor output signal at said one of said remaining M−N second outputs; and the monitor circuit measures a first monitor power of a portion of the monitor output signal which is attributable to the test input signal and controls said phase delays and said gains iteratively so as to maximize said first monitor power.

11. A self-balancing matrix amplifier according to claim 10 further comprising:

an $M^{th}$ phase adjuster connected to introduce a phase shift in the path between the last of said N first outputs and the corresponding one of said N second inputs;

an $M^{th}$ gain adjuster connected to introduce a gain in the path between the last of the N first outputs and the corresponding one of said N second inputs;

wherein the monitor circuit is connected to control the phase shift introduced by the $M^{th}$ phase adjuster and the gain introduced by the $M^{th}$ gain adjuster, and does so in the course of maximizing the first monitor power.

12. A self-balancing matrix amplifier according to claim 10 wherein the monitor circuit also measures a second monitor power of a portion of the monitor signal which is not attributable to the test signal input and controls said phase delays and said gains iteratively so as to maximize the first monitor power and to minimize the second monitor power.

13. A self-balancing matrix amplifier according to claim 10 wherein N=3 and M=4 and the N input signals comprise signals received from three radio channel units.

14. A self-balancing matrix amplifier according to claim 13 wherein the three amplified output signals are transmitted by a sectorized basestation antenna.

15. A self-balancing matrix amplifier according to claim 10 further comprising:

N combiners;

a plurality L of single pole N throw switches where L≧1, each switch having an output connectable to any one of the M combiners by appropriately controlling the switch, each switch connected to receive an input radio signal from a respective radio channel unit;

wherein the input radio signals input to all of the switches connected to a given combiner are combined to produce a respective one of said input signals.

16. A self-balancing matrix amplifier according to claim 15 wherein M=4 and N=3 and the radio channel units are connected to a sectorized basestation antenna.

17. A self balancing matrix amplifier according to claim 10 wherein the each of the input transform matrix and the output transform matrix comprises a plurality of ninety degree phase shifters arranged in stages.

18. A self balancing matrix amplifier according to claim 15 wherein:

the input transform matrix comprises a first stage of two ninety degree phase shifters connected to a second stage of two ninety degree phase shifters:

the output transform matrix comprises a first stage of two ninety degree phase shifters connected to a second stage of two ninety degree phase shifters:

the input transform matrix produces four divided signals, each divided signal being a combination of the four input signals so as to have nominally one quarter of the power of each of the four input signals, the four divided signals being then amplified by the amplifiers to produce four amplified divided signals; and the output transform matrix combines the four amplified divided signals to produced the amplified output signals, each amplified output signal nominally being an amplified version of one of the input signals.

19. A basestation transmitter comprising:

a plurality L of radio channel units where L≧1 N combiners; where N≧1 a plurality L of single pole N throw switches where L≧1, each switch having an output connectable to any one of the M combiners by appropriately controlling the switch, each switch connected to receive an input radio signal from a respective radio channel unit wherein the input radio signals input to all of the switches connected to a given combiner are combined to produce a respective one of N input signals;

an input transform matrix having M first inputs and M first outputs where M is an integer at least one greater than N, N of the first inputs being connected to receive the N input signals with the remaining M−N first inputs connected receive zero input signals;

an output transform matrix having M second inputs and M second outputs, the M second outputs including N second outputs for producing said N amplified output signals with the remaining M−N second outputs corresponding with said remaining M−N first inputs;

M amplifiers each having an amplifier input connected to a respective one of the M first outputs and having an amplifier output connected to a corresponding respective one of the M second inputs;

M−1 phase adjusters, with each of the M−1 phase adjusters connected to introduce a phase shift in the path between one of said M first outputs and the corresponding one of said M second inputs;

M−1 gain adjusters, with each of the M−1 gain adjusters connected to introduce a gain in the path between one of said M first outputs and the corresponding one of the M second inputs;

a monitor circuit connected to one of said remaining M−N second outputs and connected to control the phase shifts introduced by said phase adjusters and the gains introduced by said gain adjusters;

a sectorized antenna having N sectors connected to transmit the N amplified output signals;

wherein:

the N input signals are divided by the input transform matrix, amplified by the M amplifiers and recombined by the output transform matrix to produce the N amplified output signals at said N second outputs and a monitor output signal at said one of said remaining M−N second outputs; and the monitor circuit measures a monitor power of the monitor output signal with respect to the test input signal and controls said phase delays and said gains iteratively so as to cause said monitor power to approach zero.

20. A transmitter according to claim 19, further comprising:

an $M^{th}$ phase adjuster connected to introduce a phase shift in the path between the last of said M first outputs and the corresponding one of said M second inputs;

an $M^{th}$ gain adjuster connected to introduce a gain in the path between the last of the M first outputs and the corresponding one of said M second inputs;

wherein the monitor circuit is connected to control the phase shift introduced by the $M^{th}$ phase adjuster and the gain introduced by the $M^{th}$ gain adjuster, and does so in the course of causing the monitor power to approach zero.

* * * * *

UNITED STATES PATENT AND TRADEMARK OFFICE
CERTIFICATE OF CORRECTION

PATENT NO. : 6,006,111
DATED : 12/21/99
INVENTOR(S) : ANDY ROWLAND

It is certified that error appears in the above-identified patent and that said Letters Patent is hereby corrected as shown below:

Column 9, line 29 (Claim 1): change "M-1" to "M"

Column 10, line 4 (Claim 4): change "amplified" to "amplifier"

Column 11, line 27 (Claim 11): change "N" to "M"

Column 11, line 28 (Claim 11): change "N" to "M"

Column 11, line 30 (Claim 11): change "N" to "M"

Column 11, line 31 (Claim 11): change "N" to "M"

Signed and Sealed this

Twenty-sixth Day of September, 2000

Attest:

Q. TODD DICKINSON

*Attesting Officer*   *Director of Patents and Trademarks*